PHOTOELECTRIC RELAY DEVICE

Filed Oct. 27, 1950

INVENTORS: B. F. LEWIS
K. H. MULLER
BY
R. O. Covell
ATTORNEY

United States Patent Office 2,737,598
Patented Mar. 6, 1956

2,737,598

PHOTOELECTRIC RELAY DEVICE

Benjamin F. Lewis, Bayside, N. Y., and Karl H. Müller, Bloomfield, N. J., assignors to Bell Telephone Laboratories, Incorporated, New York, N. Y., a corporation of New York Application October 27, 1950, Serial No. 192,500

2 Claims. (Cl. 250—214)

This invention relates to photosensitive devices in electrooptical systems, and more particularly to a compact pencil-shaped photoelectric control unit capable of rapidly operating high speed relays in response to light impinging upon a photosensitive element.

In light actuated card sensing devices such as the card translator disclosed in Patent 2,558,577, granted June 26, 1951, to O. Myers, where a large number of photosensitive elements are massed in bank in close proximity to each other for the purpose of controlling a large number of separate output circuits by means of light impinging upon some of such elements through transparent portions of a perforated card, it is not possible to place control relays in close proximity to their associated light sensitive cells but rather it becomes necessary to run connecting leads of appreciable length from each light sensitive element to the associated relay which it is to control. Furthermore, because of the low power output of known photosensitive elements, it is necessary to provide amplifying means between the light sensitive elements and their connected relays.

Where a large number of light sensitive elements are grouped in close proximity to each other, as they must be in such devices as the aforementioned card translator, it becomes a serious problem to provide the necessary amplification without requiring connecting leads of considerable length between each photosensitive element and its associated amplifier. Because of the very high impedance of photosensitive elements in use today, it becomes imperative that the connecting leads between photosensitive elements and any external amplifier be kept at a minimum length in order to assure proper operation of the circuits. It has been found by experience that connecting leads of only a few inches are so long as to give rise to transient disturbances which impair the reliable operation of the output relay circuits, and the higher the speed of operation the greater the adverse effect of long connecting leads becomes.

In addition to the necessity for maintaining very short connecting leads between the photosensitive element and its associated amplifying means, the very high impedance output of suitable photosensitive elements necessitates a high degree of insulation between all of the circuit conductors to prevent the possibility of excessive leakage which would impair the proper operation of the circuit. It is also important that the entire circuit of the photosensitive element and its directly coupled amplifying means be thoroughly shielded from electrostatic and electromagnetic fields which otherwise might cause erratic operation of the light detection circuit. To solve these problems the inventors have devised a compact integrated unit comprising a photosensitive element connected with a cold cathode gaseous discharge amplifying tube and an associated fixed condenser having a very low conductance, all combined in a photodetection circuit completely enclosed within a hermetically sealed and evacuated steel container from which the amplified output is conducted by means of insulated leads at a usable impedance suitable either for further amplification or for directly operating an electromagnetic relay. The manner in which this is accomplished will be better understood from the following detailed description in reference to the accompanying drawing in which:

Figure 3:
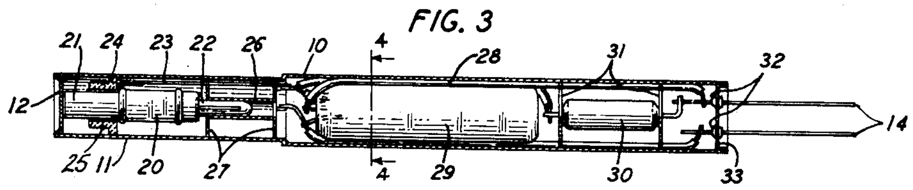
Fig. 3 is a longitudinal cut-away section showing how the structural elements of Fig. 2 are fitted within the hermetically sealed and evacuated container of Fig. 1.
Figure 4:
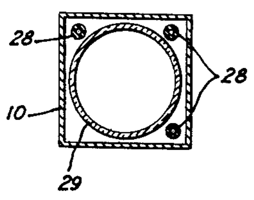
Figure 5:
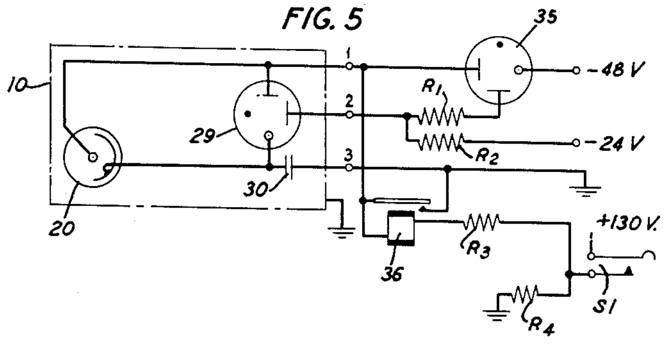

Fig. 4 is a lateral cross-section taken along the line 4—4 of Fig. 3 showing how the amplifying tube and its insulated connecting leads are fitted within the internal space of the container; and Fig. 5 is a schematic circuit diagram showing within the dotted rectangle the electrical connections of the circuit elements within the sealed container, and showing one form of external circuit which may be connected therewith.

Figure 1:
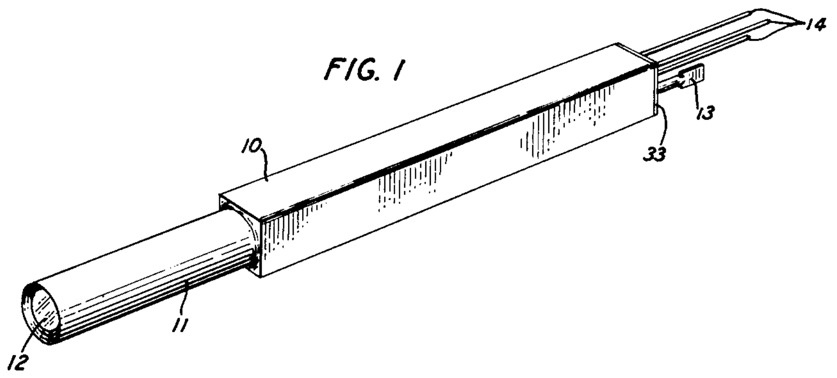
Fig. 1 represents a perspective external view of the completed photodetection unit.

Referring now in greater detail to Fig. 1 of the drawing, we see the external appearance of the unit casing 10 which in its preferred embodiment is a rectangular tube of low reluctance magnetic material having a portion thereof at one end reduced to cylindrical form 11, with an optical aperture 12, which in the preferred embodiment may be a glass window sealed to the metallic cylinder by means suitable for maintaining a vacuum within the cylinder, and having at the opposite end thereof a nipple 13 by means of which gases within the container are evacuated subsequent to assembly of the internal structure. Three leads 14 are brought out of the closed end of the container opposite from the window opening 12, as means connecting with the internal circuit elements.

Figure 2:
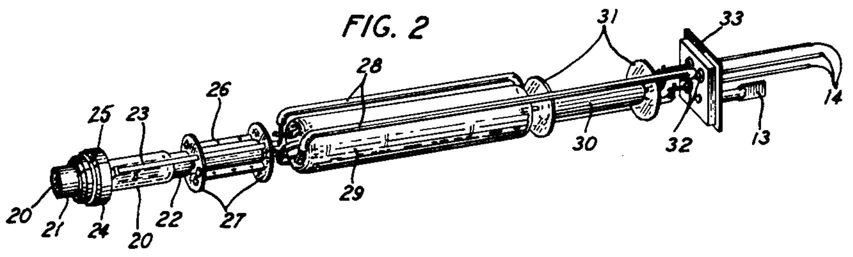
Fig. 2 is a perspective view of the internal structure of the various elements comprised within the sealed unit of Fig. 1.

Referring now to Fig. 2 of the drawing, 20 represents a photosensitive element which in the preferred embodiment is a caesium antimony type of photoemissive cell having its external conductors in the form of a metallic collar 21 around the photosensitive end thereof and a metallic pin 22 protruding from the opposite end thereof. Electrical contact is made between metallic conductor 23 and metallic collar 21 by means of a split collar 24 which is held in place by spring 25. The collar 24 is of insulating material. Pin 22 plugs into jack 26 as means of making electrical contact with the other element of the photoelectric cell 20, which is concentrically supported within the cylindrical shell of Fig. 1 by means of insulating collar 24 and insulating spacer discs 27 which may be formed of mica or other suitable insulating material. The cylindrical element 29 is the glass envelope of an amplifying tube which in the preferred embodiment is a three-element cold cathode gas discharge type the schematic circuit of which may be seen at 29 in Fig. 5 of the drawing. Conductor leads 28 which are enclosed within high dielectric insulating sleeving, may be soldered or welded to the appropriate terminals of the amplifier tube 29. A third such conductor similarly insulated is hidden from view in the drawing of Fig. 2 but may be seen extending along the bottom side of the tube 29 in Fig. 3 of the drawing. To the right of amplifier tube 29 may be seen a fixed capacitor 30, which is preferably of the ceramic type, mounted between two insulated spacer discs 31 which may be made of mica or other suitable insulating material. The three output leads 14, two of which are connected through insulated sleeving to one end of the amplifier tube 29 and the third of which is connected to the ceramic condenser 30, are insulatingly sealed by bushings 32 through the metal end plate 33.

Referring now in greater detail to Fig. 3 of the drawing, the combination of circuit elements described in reference to Fig. 2 may here be seen as hermetically sealed within the enclosing ferrous metallic cylinder. In this cut-away view, the light sensitive end of the photoelectric tube 20 may be seen adjacent to the glass window 12 at the left-hand end of Fig. 3. The amplifying tube 29 and ceramic condenser 30 may also be seen snugly fitted within the enclosing metallic container. In assembly, the end plate 33 is soldered to the cylindrical shell prior to evacuation. The insulating bushings 32, by means of which leads 14 pass through the metallic end plate 33, may be of glass or any other suitable insulating material capable of being sealed into the metallic end plate. Certain details of the collar 25, herein disclosed in part, are disclosed and claimed in Patent 2,636,128 granted April 21, 1953, to R. L. Vance.

Fig. 4, being a cross-section along the line 4—4 of Fig. 3, shows the manner in which the insulated leads 28 are fitted around the amplifying tube 29 in the corner spaces of the rectangular portion of the metallic container 10.

Referring now to Fig. 5 of the drawing we will trace the electrical circuit of the photodetection unit. It will be observed that the circuit elements enclosed within the box 10 correspond to the principal elements previously discussed in reference to Fig. 2 which are enclosed within the metallic container 10 as seen in reference to Figs. 1, 3 and 4 above. It will be noted that the metallic container is preferably grounded to provide electrostatic shielding of the circuit elements enclosed therein. In Fig. 5 it is seen that the anode of the photoelectric tube 20 is connected to the anode of the gas discharge tube 29 and that the anodes of both of these tubes are in turn connected to external terminal 1. The cathode of the photoelectric tube 20 is connected to the control anode of the gas tube 29 and also to one side of condenser 30, the other side of which is connected to external terminal 3 which is normally grounded. The main cathode of gas tube 29 is connected to external terminal 2 which is normally connected to a suitable source of negative potential. The anode terminal 1 is connected through the winding of relay 36 and load resistor $R_3$ to a suitable source of positive potential. In the deenergized condition of the circuit of Fig. 5, with light falling on the photosensitive element, key $S_1$ is open so that the anodes of tubes 20, 29 and 35 are at ground potential through resistor $R_4$ which may be of the magnitude of 1 megohm, the gas tubes 29 and 35 are extinguished, and the relay 36 is released. Any charge remaining on condenser 30 is of such a low magnitude as to be insufficient to produce the voltage on the control anode of tube 29 necessary to produce breakdown condition within the tube. In operation when key $S_1$ is closed, a photoelectric current which may be of the order of $\frac{4}{10}$ microampere, flows through the phototube 20 to build up a charge on condenser 30. When the charge on condenser 30 builds up to a sufficient magnitude, a discharge occurs between the cathode and control anode of gas tube 29 thus producing complete ionization of the gas within the tube and permitting current flow from the main anode to the cathode of gas tube 29 in a manner which is well known in the art. If the relay 36 is sufficiently sensitive, this current flow through the main anode-cathode path of gas tube 29 may be sufficient in and of itself to cause operation of the relay 36. However, if it should be desired to employ a heavy duty relay at 36, the current flow through gas tube 29 may be insufficient to cause relay operation and in this event any one of several alternative circuits may be employed externally to gain sufficient current flow to operate the relay as desired. Thus an additional gas discharge tube 35, which may be of a larger capacity adapted for more heavy duty than the small gas tube 29 enclosed within the sealed cylinder 10 may be coupled to the relay 36 in the manner illustrated by the circuit of Fig. 5. In this arrangement the current through the main anode-cathode path of tube 29 produces a voltage drop across resistor $R_2$ which is applied to the control anode of tube 35 through resistor $R_1$ to produce trigger action causing current flow between the main anode and cathode of tube 35 in such manner that the current through tube 35 flows through the winding of relay 36 to cause its operation.

This relay 36, which may be in a register circuit as controlled by a card translator, may have provision for locking itself up as illustrated in the circuit of Fig. 5. When relay 36 locks up it extinguishes gas tube 35 and also tube 29, unless the latter tube has already been extinguished by the prior operation of tube 35. Subsequent opening of key $S_1$ releases locked-up relay 36. Recommended values of potential sources are indicated in the drawing of Fig. 5. Typical values which may be chosen for the other components of the circuit are as follows: $R_1$ and $R_2$ may each be of 100,000 ohms. $R_3$ may have a value of 3000 ohms. $R_4$ may be of the order of 1 megohm. Relay 36 may be of any desired type, such as those commonly employed in telephone practice. Tubes 29 and 35 may be any three-element, cold cathode, gaseous discharge tubes, of which many types are well known in the art. In the preferred embodiment of the invention, the photoelectric tube 20 may be of the caesium antimony cathode type, although other types of photosensitive detectors may be employed as well. The fixed condenser 30 is preferably a high quality ceramic type having a capacity of approximately 50 micromicrofarads.

Of course, it will be understood that the invention is not limited to the specific values of components or magnitudes of potentials herein designated in the preferred embodiment but that numerous variations in structure and circuit may be made without departing from the spirit of the invention as defined by this disclosure and appended claims.

What is claimed is:

1. A photoelectric control unit comprising an elongated evacuated container of magnetic material, a transparent element sealing one end thereof, a light sensitive tube enclosed within said container adjacent said transparent element, a pin integral with said tube, a jack enclosed within said container engaging said pin, means holding said jack coaxial with said container, an end plate sealing the other end of said container, a condenser enclosed within said container adjacent said end plate, a cylindrical gaseous discharge device enclosed within said container intermediate said jack and said condenser, means including a conductor positioned by said holding means electrically interconnecting said tube, said condenser and said device, and means including said jack connecting said tube to said device.

2. A photoelectric control unit comprising an elongated evacuated container of magnetic material, said container comprising a first right-circular cylindrical portion and a second cylindrical portion of square cross-section, a transparent element sealing the extreme end of the first portion of said container, a cylindrical light sensitive tube positioned adjacent said element, a pin integral with said tube, a jack engaging said pin, insulating means for holding said jack coaxial with the first portion of said container, means comprising said jack, said insulating means, and an insulating collar engaging said tube at the opposite end thereof from said jack for holding said tube coaxial with the first portion of said container, an end plate sealing the extreme end of the second portion of said container, a condenser adjacent said end plate, a pair of insulating discs holding said condenser coaxial with the second portion of said container, a cylindrical gaseous discharge device enclosed within the second portion of said container intermediate said jack and said container, means including said collar electrically interconnecting said tube, said condenser and said device, and means including said jack connecting said tube to said device.

References Cited in the file of this patent

UNITED STATES PATENTS

| | | |
|---|---|---|
| 1,546,264 | Story | July 14, 1925 |
| 2,049,647 | Geffcken et al. | Aug. 4, 1936 |
| 2,207,097 | Logan | July 9, 1940 |
| 2,374,287 | Henry | Apr. 24, 1945 |
| 2,420,716 | Morton et al. | May 20, 1947 |
| 2,512,247 | Fua et al. | June 20, 1950 |
| 2,565,716 | Boyce | Aug. 28, 1951 |
| 2,636,128 | Vance | Apr. 21, 1953 |